United States Patent [19]

Schiller et al.

[11] Patent Number: 4,915,774

[45] Date of Patent: Apr. 10, 1990

[54] METHOD OF MANUFACTURING ORIENTATED SUBSTRATE PLATES FROM SOLID SEMICONDUCTOR BLOCKS FROM THE III-V GROUP

[75] Inventors: Claude Schiller, Savigny-sur-Orge; Jean-Pierre Farges, Soignolles, both of France

[73] Assignee: U.S. Philips Corporation, New York, N.Y.

[21] Appl. No.: 217,537

[22] Filed: Jul. 11, 1988

[30] Foreign Application Priority Data

Jul. 9, 1987 [FR] France ................ 87 09736

[51] Int. Cl.$^4$ ................ C30B 15/00; C30B 15/20; C30B 15/26
[52] U.S. Cl. ................ 156/617.1; 156/620.2; 156/DIG. 70; 156/647; 437/249
[58] Field of Search ............ 156/617.1, 620.1, 620.2, 156/607, DIG. 70, DIG. 98, DIG. 111, DIG. 65; 437/647, 249

[56] References Cited

U.S. PATENT DOCUMENTS

| | | | |
|---|---|---|---|
| 3,144,357 | 8/1964 | Hulme et al. | 156/620.2 |
| 3,887,404 | 6/1975 | Chané156 | 647/ |
| 4,075,055 | 2/1978 | Ciszek et al. | 156/DIG. 65 |
| 4,121,965 | 10/1978 | Leipold | 156/620.1 |
| 4,442,178 | 4/1984 | Kimura et al. | 156/DIG. 65 |
| 4,645,560 | 2/1987 | Matsumoto et al. | 156/620.1 |
| 4,755,314 | 7/1988 | Sakaguchi et al. | 156/617.1 |

OTHER PUBLICATIONS

Faust, Jr., J. W., Etching of II-V Intermetallic Compounds; Compound Semiconductors, Preparation of III-V Compounds vol. 1; Rheinhold Publishing Co., New York, NY, 1963; pp. 445-468.

Primary Examiner—Gary P. Straub
Assistant Examiner—M. Franklin
Attorney, Agent, or Firm—Norman N. Spain

[57] ABSTRACT

Method of manufacturing orientated substrate plates from solid semiconductor blocks of the III-V group.

The invention relates to a method of manufacturing to obtain substrate plates prepared to receive integrated semi-conductor circuits of materials of the III-V group obtained by pulling according to Czochralski. These materials having anisotropic properties, upon which the performances of the semiconductor devices depend, it is of major importance to differentiate the crystallographic axes of teach plate with an accuracy higher than half the degree. According to the invention, this differentiation is effected in two steps. The first step consists in the differentiation of the axes from the formation of pulling nucleus. For this purpose, the pulling nucleus is a rectangular parallelepipedon, one edge of which has a facet serving as a recess for fixing the seed crystal the pulling operation. This facet is defined with respect to the characteristic axes of the ingot obtained by pulling and is maintained by respect to these axes and until flats are formed on the ingot. The size of these flats identifying this information till the concretization of the said information by the size of the two flats on the ingot itself. The pulling nucleus thus defined being used a large number of times, the method according to the invention results in a considerably saving of time during the industrial processing of the substrates.

9 Claims, 4 Drawing Sheets

METHOD OF MANUFACTURING ORIENTATED SUBSTRATE PLATES FROM SOLID SEMICONDUCTOR BLOCKS FROM THE III-V GROUP

BACKGROUND OF THE INVENTION

The invention relates to a method of manufacturing orientated substrate plates for integrated semiconductor devices from ingot of semiconductor material of the III-V group, this method comprising at least the steps of:

(a) comprises a monocrystalline pulling nucleus of this material of the III-V group having an axis of symmetry parallel to a crystallographic axis $\vec{OZ}$;

(b) pulling parallel to this crystallographic axis $\vec{OZ}$ and by the Czochralski method a monocrystalline ingot from this pulling nucleus;

(c) shaping the ingot to give it the shape of a cylinder whose axis coincides with the pulling axis;

(d) determining with an accuracy higher than half the degree obtained by a method using the diffraction of the X-rays the direction of two orientated crystallographic characteristic axes $\vec{OU}$ and $\vec{OV}$ of the straight section of the cylinder, these axes forming with the pulling axis $\vec{OZ}$ an orthonormal reference ($\vec{OU}, \vec{OV}, \vec{OZ}$);

(e) forming on the body of the cylinder parallel to the axis $\vec{OZ}$ a major flat perpendicular to the axis $\vec{OU}$ and a minor flat perpendicular to the axis $\vec{OV}$;

(f) forming substrate plates by cutting into pieces the ingot, the information of the differentiation of the crystallographic axes $\vec{OU}$ and $\vec{OV}$ being maintained due to the fact that during the step of cutting a major and a minor cant-wall resulting from the major and the minor flat, respectively, are formed on the substrate plates.

The invention is used in the industrialization of the method of manufacturing the substrate plates for integrated circuits and other electronic or electrooptical devices of new semiconductor materials and especially semiconductor materials of the III-V group, such as indium phosphide (InP).

As is known from European Patent Applications No. 0 191 530 and No. 872300403.1, in order to obtain a substrate plate from a solid monocrystalline semiconductor material especially of the III-V group, this solid material must be formed by pulling according to Czochralski from a nucleus, whose axis is orientated along the crystallographic axis [0 0 1]; subsequently, the ingot obtained is cut into lamellae, whose crystallographic planes and axes must be known with an accuracy higher than half the degree. In fact, it is known from the publication of H. C. Gatos and M. C. Lavine in J. Electrochem. Soc. 107 (1960), p. 427, that these semiconductor materials have anisotropic properties and that the performances of the electronic or electrooptical circuits formed later on these substrates depend upon the orientation of the substrate and of the elements on the substrate.

It is known from the aforementioned Patent Applications to use as method of defining the orientations of the crystallographic planes and axis of the ingot of semiconductor material and of the substrate plates which are pulled therefrom the method of Laüe by diffraction of X-rays. This method allows the derivation of the orientations of the elements of the crystallographic lattice and especially of the axes [110] and [11$\bar{0}$] from photography of the characteristic diffraction spots and of the very accurate measurement of the distances between spots. The axes are then defined in the form of flats perpendicular to these axes and parallel to the pulling axis from the ingot. During the cutting of the lamellae, these flats form cant-walls, which avoid restarting the definition of the axes, plates after plates.

However, frequently the use only of the method of Laüe does not permit the differentiation between the axis [110] and the axis [11$\bar{0}$]. At is of greater importance with a view to the anisotropy of the properties of certain semiconductors and especially of the semiconductors of the III-V group that these axes are not confused. It is therefore necessary to differentiate them.

This differentiation is effected nowadays by two methods. The first method is known from European Patent Application No. 87 200 403.1 and is used exclusively with crystals, such as gallium arsenide, which have relatively to the axis [110] a characteristic diffraction spot having an intensity greatly different from that of the characteristic diffraction spot relative to the axis [11$\bar{0}$]. This first method therefore consists in using the Laüe method for each of the flats shaped perpendicularly to the axes [110] and [11$\bar{0}$] to differentiate these axes by their diffraction spots and to form, for example, the flat perpendicular to the axis [110] of a surface larger than that of the flat perpendicular to the axis [11$\bar{0}$] in order to maintain this information by a cant-wall larger after cutting of the plates. This method is discussed in "La Revue Annuelle LEP 1981, p. 55-56" edited by "Service Information des Laboratoires d'Electronique et de Physique Appliquée, 3 Avenue Descartes 94450 Limeil-Brevannes, France".

However, this method cannot be used for certain semiconductor materials, such as indium phosphide, which have diffraction spots relative to the axes [110] and [$\bar{1}$10] of practically the same intensity.

It is also known, as applicable with any semiconductor material and especially to indium phosphide, to differentiate the axis [110] from the axis [11$\bar{0}$] by anisotropic etching of a (001) surface either of the ingot or of an already cut plate. For this purpose, a (001) surface is prepared either on the ingot or on a plate and a system of masks is formed in the form of strips parallel to the axes [110] and [11$\bar{0}$]. This method is described in "Journal of Crystal Growth" 58 (1982), 409–416.

However, these two methods have disadvantages; the first method is rapid and does not lengthen the industrial process due to the fact that all results appear simultaneously by the method of Laüe. Thus, the definition and the differentiation of the axis are obtained by the same operation. However, this method is not useful for all types of crystals. The second method can be used for all types of crystals, but will lengthen the time required for the industrial processing of the monocrystals or of the plates due to the fact that the definition and the differentiation of the axes [110] and [11$\bar{0}$] are effected by two successive operations.

SUMMARY OF THE INVENTION

The present invention proposes a method as described in the preamble, which allows differentiating the axes [110] and [11$\bar{0}$] characteristic of the straight section of the monocrystalline ingots for all types of crystals, while reducing the time required for the industrial process.

According to the invention, this object is achieved by means of a method as described in the preamble, characterized in that the differentiation between the crystallographic axes characteristic of the straight section of the cylinder is obtained during the step of forming pulling nucleus and in that a mark of this differentiation is applied to this nucleus to maintain the information of this differentiation till the step of forming the major and minor flats on the cylinder, which constitute a marking suitable to maintain this information till the step of forming the substrate plates.

Thus, by the use of the same seed crystal being used a large number of times for drawing a large number of blocks, the method of manufacturing according to the invention results in considerably simplifying the industrial process of obtaining substrate plates while considerably reducing the number of operations relative to the identification of the axes characteristic of the surfaces of the plates.

BRIEF DESCRIPTION OF THE DRAWING

FIG. 3b shows a test plate prepared for the identification of the axes characteristic of the material from the plate shown in FIG. 3a;

DETAILED DESCRIPTION OF THE INVENTION

Figure 1A:
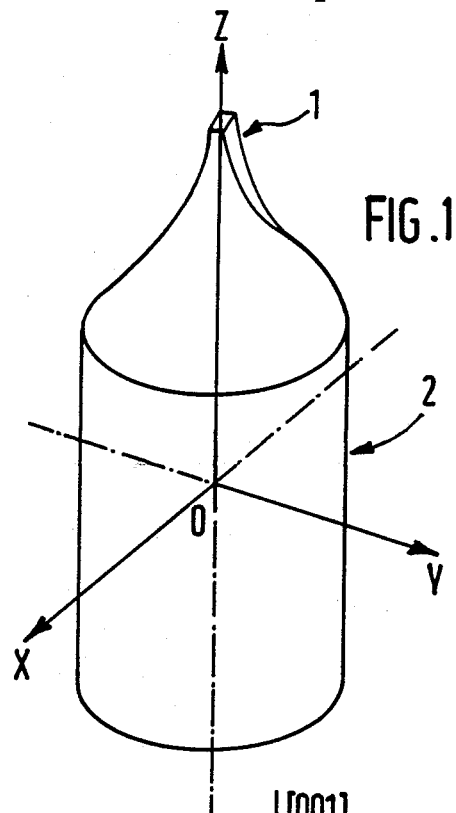
FIG. 1a shows an ingot of semiconductor material still provided with its pulling nucleus.

FIG. 1a shows an ingot of monocrystalline semiconductor material obtained by pulling by the Czochralski method known, for example, from the publication ACTA ELECTRONICA, Vol. 13, January 1970, No. 1, p. 17-21. See also "La Revue Annuelle LEP 1979", p. 7-8, edited by "SErvice Information des Laboratoires d'Électronique et de Physique appliquée", 3 Avenue Descartes, 94450 Limail-Brevannes, France. This ingot comprises a pulling nucleus 1 attached to an ingot 2.

The seed crystal ingot has a substantially cylindrical shape, the axis of the cylinder coinciding with the pulling axis. This axis is chosen to be parallel to an axis $\overrightarrow{OZ}$ of the crystallographic lattice, the point Z being chosen on the side of the nucleus and the the point O on the side of the pulling bath.

The ingot is moreover orientated with respect to two other crystallographic axes $\overrightarrow{OX}$ and $\overrightarrow{OY}$ chosen to form with $\overrightarrow{OZ}$ a triangular trihedron orientated in the direct trigonometric sense. Moreover, two axes $\overrightarrow{OU}$ and $\overrightarrow{OV}$ are determined, which are situated in the plane $\overrightarrow{OX}$, $\overrightarrow{OY}$ and constitute crystallographic privileged directions for the realization of the integrated circuits. These axes are chosen due to the fact of the particular properties associated with the anisotropy the crystal shows in these directions. The system ($\overrightarrow{OU}$, $\overrightarrow{OV}$, $\overrightarrow{OZ}$) forms a direct triangular trihedron.

In order to maintain the information of the orientation of the ingot with respect to the axes $\overrightarrow{OU}$ and $\overrightarrow{OV}$, flats are formed on the body of the cylinder parallel to the pulling axis $\overrightarrow{OZ}$: a first flat $M_1$ perpendicular to the axis $\overrightarrow{OU}$ and formed on the side of the point U; and a second flat $M_2$ perpendicular to the axis $\overrightarrow{OV}$ and formed on the side of the point V.

Figure 1B:
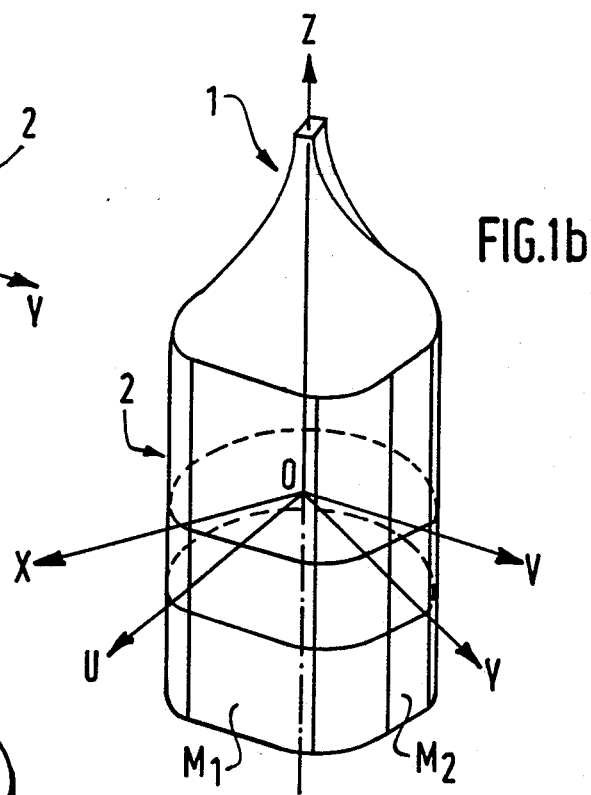
FIG. 1b shows the same ingot provided with defining flats.

In order to maintain the information which allows the differentiating the axis $\overrightarrow{OU}$ from the axis $\overrightarrow{OV}$, one of the flats, in this case $M_1$, is provided with a larger surface than the second flat, in this case $M_2$. The ingot, with seed crystal attached and thus oriented and provided with reference marks is shown in FIG. 1b.

During the processing of the integrated circuits, the substrate plates are obtained by cutting the ingot into pieces a direction perpendicular or substantially perpendicular to the axis $\overrightarrow{OZ}$. The knowledge of the position of the axes $\overrightarrow{OU}$ and $\overrightarrow{OV}$ with respect to the surface plane of the substrate plates must be very precise. In fact, the semiconductor materials show strongly anistropic properties and the performances especially of the active elements formed at their surfaces are significantly different dependent upon whether these elements are formed parallel to one axis or to another axis.

As already been stated above, hitherto the determination of the directions of the crystallographic axes $\overrightarrow{OU}$ and $\overrightarrow{OV}$ was effected by X-ray diffraction methods, either directly on the ingot or on the substrate plates before any use. In this first time the flats $M_1$ and $M_2$ were formed to be equal. Subsequently, the differentiation of these axes was effected by the use of chemically etched figures characteristic of each of these directions, in a manner so that in this second time one of the flats, for example $M_1$, was enlarged.

Figure 2:
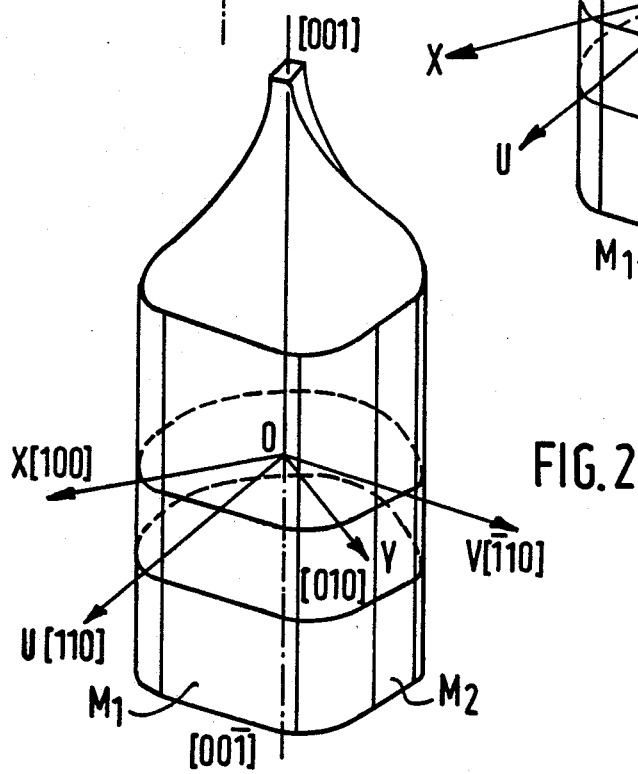
FIG. 2 shows an ingot of indium phosphide (InP) and its axes and defining facets.

FIG. 2 shows an ingot of a semiconductor material of the III–V group such as obtained by pulling. This material will be, for example, gallium arsenide (GaAs) or indium phosphide (InP). In order to produce integrated circuits of high performance, these ingots are preferably pulled along the axis [001] and the substrate plates are defined with respect to the axes [110] and [1$\bar{1}$0]. The flat $M_1$ is chosen, for example, to be perpendicular to the axis [110], i.e. parallel to the plane (110), while the flat $M_2$ is chosen to be perpendicular to the axis [1$\bar{1}$0], i.e. parallel to the plane (1$\bar{1}$0).

FIGS. 3a, 3b, 4a, 4b, 4c and 4d illustrate the use of the method of differentiating the axes $\overrightarrow{OU}$ and $\overrightarrow{OV}$ by means of chemical etch figures as known from the prior art and applied to gallium arsenide (GaAs) or to indium phosphide (InP). The axes $\overrightarrow{OZ}$, $\overrightarrow{OU}$ and $\overrightarrow{OV}$ are in this case [001 [110] and [1$\bar{1}$0], respectively.

Figure 3A:
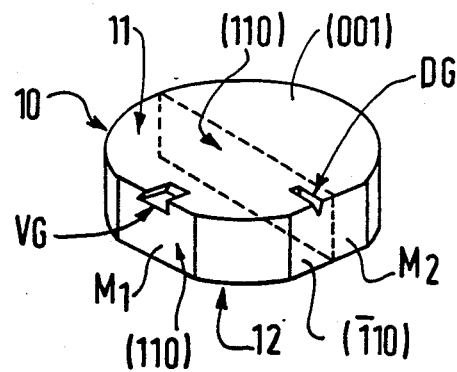
FIG. 3a shows a cut plate in the solid block of indium phosphide (InP)
Figure 3B:
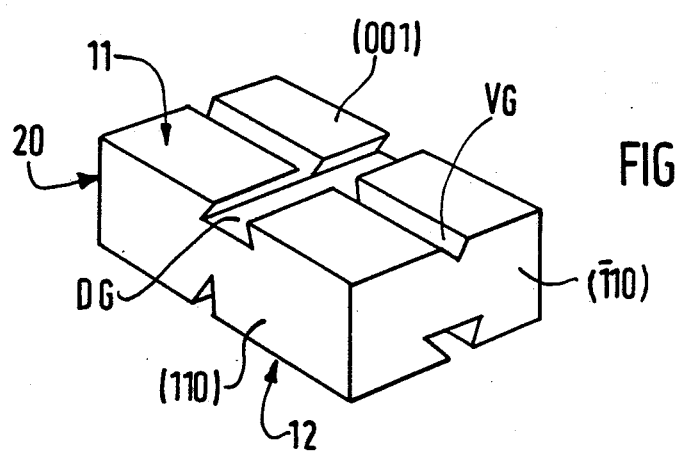
Figure 4A:
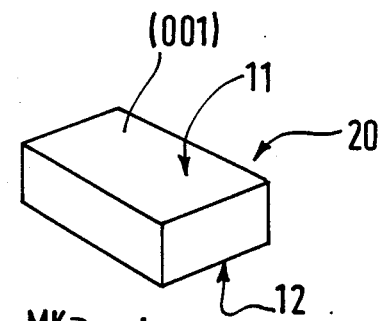
FIGS. 4a to 4d illustrate the steps of the method leading to the identification of the axes of a test plate.
Figure 4B:
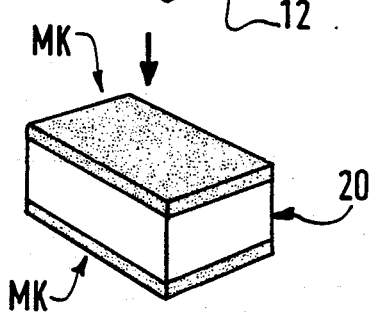
Figure 4C:
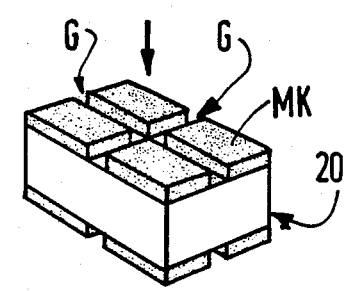
Figure 4D:
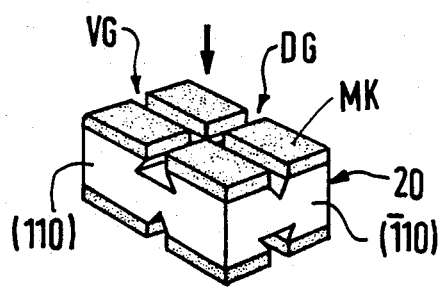

FIG. 3a shows a plate 10 formed by cutting into pieces the ingot 2 perpendicularly to the pulling axis, while FIG. 4a shows a rectangular plate 20 cut from in the plate 10. The plate 20 has a surface 11 parallel to the plane (001) and an opposite surface 12 parallel to the plane (00$\bar{0}$). According to the known method of differentiating the axes, a layer of photosensitive lacquer serving as a mark MK is applied to the surface 11 and to the surface 12, respectively, of the plate 20, as shown in FIG. 4b. Subsequently, grooves are formed by development of the lacquer parallel to the axes [110] and [1$\bar{1}$0] on the surface 11 and on the surface 12, the directions of these axes having been determined before by X-ray diffraction. This step is illustrated in FIG. 4c. Finally, the plate 20 thus prepared is subjected to a chemical etching treatment, which causes grooves G to appear in the opening, which grooves are etched into the semiconductor material, as shown in FIG. 4d and in FIG. 3b, after elimination of the masks MK. It is thus known from the prior art that the grooves of the surface 11 (001), which are parallel to the axis [$\bar{1}$10], are in the form of a V, while those parallel to the axis [110] are in the form of a dovetail. These grooves are designated by DG and VG in FIGS. 3 and 4, respectively. On the other hand, this result is reversed on the surface 12 {00$\overline{1}$}.

Thus, according to this known method, the axes [110] and [$\overline{1}$10] can be differentiated. In order to maintain the information obtained, the flat M$_1$ is then enlarged. This known differentiation method is time-consuming and complicated. In a simpler manner and as shown in FIG. 3a, two small zones can be reserved on the plate 10 in the directions of the axes to be differentiated, the remainder of the surfaces of the plate being masked, while the chemical etching can be effected in these small zones. Characteristic V-shaped figures (VG) or dovetail-shaped figures (DV) then appear, which permit of differentiating the axes. This method is in fact practically as time-consuming as the preceding method due to the fact that it comprises all the steps thereof except for the step of cutting the plate 20.

The present invention proposes a method which permits of eliminating this complexity.

According to the invention, the differentiation of the axes $\overrightarrow{OU}$ and $\overrightarrow{OV}$ is effected from the formation of the pulling nucleus.

Figure 5A:
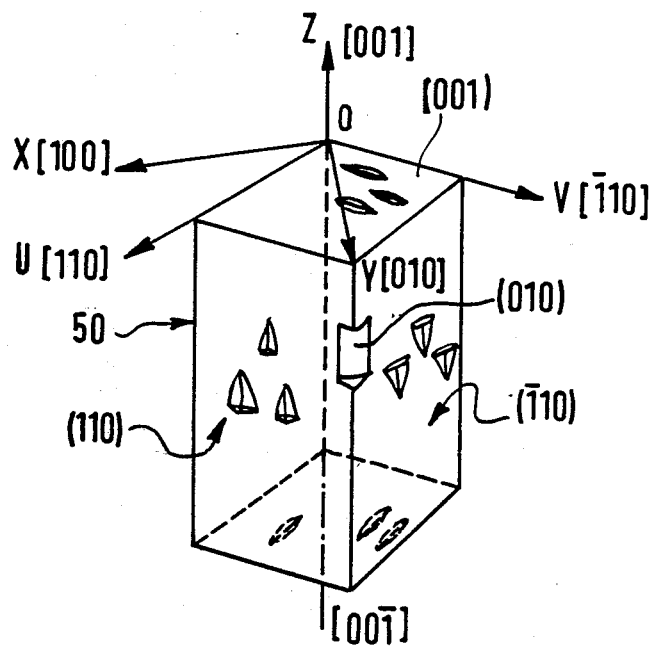
FIG. 5a and 5b show the two possibilities of obtaining the nuclei according to the invention.
Figure 5B:
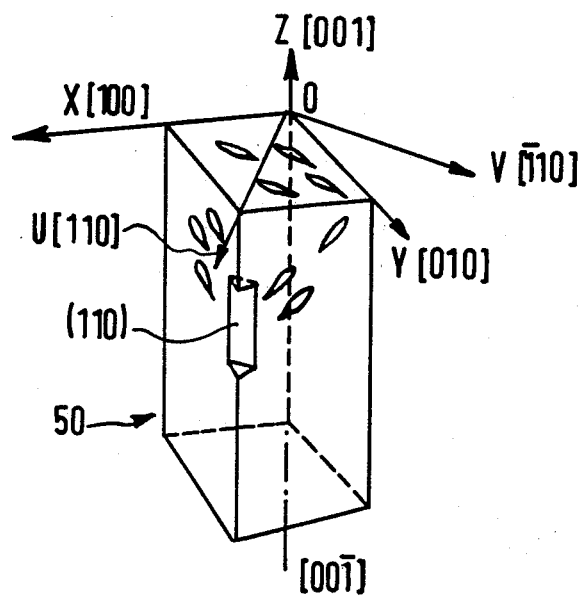

As shown in FIG. 5a, and FIG. 5b, pulling nucleus is produced in the form of a prism having a square base (a rectangular parallelpiped) whose axis is parallel to the pulling axis OZ. Two possible advantageous positions then exist for the lateral surfaces of the prism.

FIG. 5a shows a first possible advantageous position, in which the lateral surfaces are pairwise parallel to the axes $\overrightarrow{OU}$ and $\overrightarrow{OV}$, respectively. Thus, in the example chosen of gallium arsenide (GaAs) and of indium phosphide (InP), the later surfaces are parallel to the axes [110] and a [$\overline{1}$10], respectively, that is to say that they are (110) and ($\overline{1}$10) planes, respectively, the axis of the prism being the axis [001].

FIG. 5b shows the second possible advantageous position, in which the lateral surfaces of the prism are at 45° to the axes $\overrightarrow{OU}$ and $\overrightarrow{OV}$, respectively. These axes are therefore situated in the diagonal planes of the dihedron formed by the surfaces.

In the chosen example of gallium arsenide (GaAs) and of indium phosphide (InP), in which the axes $\overrightarrow{OU}$ and $\overrightarrow{OV}$ are at 45° to the axes $\overrightarrow{OX}$, $\overrightarrow{OY}$, the surfaces of the prism are therefore parallel to the axes $\overrightarrow{OX}$, $\overrightarrow{OY}$. Thus, the axes [110] and [$\overline{1}$10] are situated in the diagonal planes and the surfaces are therefore parallel to the axes [110] and [$\overline{1}$10], the axis of the prism being parallel to the axis [001]. The lateral surfaces of the prism are (010) and (100) planes, respectively.

By means of these pulling nucleus, the monocrystalline ingots obtained have as the axis of symmetry of cylinder the axis $\overrightarrow{OZ}$ [001], as already stated. In the pulling conditions of the Czochralski method, if the axes $\overrightarrow{OU}$ and $\overrightarrow{OV}$ are defined and differentiated in a visible and permanent manner on the pulling nucleus, the direction of these is kept constant in the ingot and consequently this information remains valid at any point of the ingot.

The orientation of the lateral surfaces of the nucleus with respect to the axes $\overrightarrow{OU}$ and $\overrightarrow{OV}$ is effected in a very precise manner by the known method of diffraction of the X-rays.

The differentiation of the axes $\overrightarrow{OU}$ and $\overrightarrow{OV}$ of the ingot is therefore effected according to the invention by the differentiation of the planes forming the lateral surfaces of the rectangular parallelpiped constituting pulling nucleus.

For this purpose, the seed crystal already shaped into the form of a prism of square base, whose lateral surfaces are either parallel to at 45° to the axes OU and OV, but not yet differentiated, is immersed in a chemical etching bath without any masking.

Advantageous examples of such baths are:
for gallium arsenide: 5 volumes of sulphuric acid ($H_2SO_4$), 1 volume of hydrogen peroxide and ($H_2O_2$), 1 volume of water ($H_2O$) at the temperature of, for indium phosphide (InP): 1 volume of sulphuric acid ($H_2SO_4$) 1 volume of hydrogen peroxide ($H_2O_2$), and 1 volume of water ($H_2O$). In both cases the seed crystal is immersed at the temperature of the mixture, i.e. about 60° for 2 minutes.

The surfaces of pulling nucleus, very finely etched figures, then appear, but these figures are nevertheless sufficient for their differentiation. These chemically etched figures are represented on the pulling nucleus shown in FIGS. 5a and 5b, respectively.

In FIG. 5a, attempts are made in the case of gallium arsenide and indium phosphide to differentiate the surfaces parallel to $\overrightarrow{OU}$ or to $\overrightarrow{OV}$. As shown in this Figure, the axis $\overrightarrow{OZ}$ will be placed in a vertical position and directed upwards and the reference symbol ($\overrightarrow{OU}$, $\overrightarrow{OV}$, $\overrightarrow{OZ}$) will be orientated in directed sense if it is considered that the etch figures on the upper square surface (001) are elongate and parallel to $\overrightarrow{OV}$ [1$\overline{1}$0], while the etch figures on the lower square surface (00$\overline{1}$) are elongate and parallel to $\overrightarrow{OU}$ [110]. The lateral surfaces parallel to the axis $\overrightarrow{OU}$, which in the example chosen here are ($\overline{1}$10) and (1$\overline{1}$0) planes, show etch figures in the form of arrow points directed downwards. On the contrary, the lateral surfaces parallel to the axis $\overrightarrow{OV}$, which in this example are (110) and ($\overline{1}\overline{1}$0) planes show etch figures in the form of arrow points directed towards the point 2.

Now it is necessary, in order to render the pulling nucleus apt to fulfil its function, to provide it with a recess so that it can be fixed on the Czochralski pulling assembly.

This recess will serve as an ultimate and permanent definition of the axes $\overrightarrow{OU}$ and $\overrightarrow{OV}$. In the example shown in FIG. 5a, it will be formed on the edge situated in the diagonal plane of the angle formed by ($\overrightarrow{OU}$, $\overrightarrow{OV}$). It will therefore constitute a (010) facet and is perpendicular to the axis $\overrightarrow{OY}$.

Thus, the information of the differentiation of the axes $\overrightarrow{OU}$ and $\overrightarrow{OV}$ is maintained during the whole method of manufacturing the substrate plates without it being necessary to carry out new operations for differentiating these axes.

Moreover, the same pulling nucleus being utilized a large number of times, the saving in time is multiplied by the number of times of use.

In FIG. 5b, attempts are made in the case of gallium arsenide and indium phosphide to differentiate the surfaces at 45° of $\overrightarrow{OU}$ and $\overrightarrow{OV}$, i.e. the surfaces parallel to $\overrightarrow{OX}$ and $\overrightarrow{OY}$. As shown in this Figure, the axis $\overrightarrow{OZ}$ will be placed in vertical position and directed upwards and the reference symbol ($\overrightarrow{OX}$, $\overrightarrow{OY}$, $\overrightarrow{OZ}$) will be oriented in direct sense if it is considered that the etch figures on the upper square surface (001) are elongate and parallel to the axis $\overrightarrow{OV}$, while the etch figures on the lower square surface (00$\overline{1}$) are elongate and parallel to the axis $\overrightarrow{OU}$. The lateral surfaces of the prism, which in the case described here are (100) planes and (010) planes, carry elongate etch figures inclined at 45° with respect to the planes defined by the bases of the prism. These etch figures allow the defining an edge of the prism situated in a diagonal plane containing, for example, the axis $\vec{OU}$. A recess serving both for this differentiation and for fixing the nucleus in the pulling assembly will then be realized, as already stated above. In this example, the recess will be a (110) facet.

What is claimed is:

1. A method of manufacturing oriented substrate plates of a III-V-material, which comprises:
   (a) forming a monocrystalline pulling nucleus of the III-V material having crystallographic axes OU, OV and OZ which axes form an orthonormal system;
   (b) pulling according to the Czochralski method a monocrystalline ingot of the III-V-material using the nucleus with its axis OZ parallel to the pulling direction;
   (c) shaping the ingot into the form of a more perfect cylinder with its axis parallel to the axis OZ;
   (d) determining by X-ray diffraction the direction of the crystallographic axes OU and OV of the ingot which form with the axis OZ an orthonormal system;
   (e) shaping on the ingot a major flat perpendicular to the axis OU and a minor flat perpendicular to the axis OV and
   (f) cutting substrate plates from the ingot perpendicular to the axis OZ, characterized in that,
   (g) during step (a) the seed crystal further is shaped into the form of a rectangular prism with flat perpendicular to its crystallographic axis OU and OV, which flats then are slightly etched in an etching bath which preferentially attacks the III-V-material and
   (h) during steps (c) and (d) the seed crystal remains attached to the ingot.

2. A method as claimed in claim 1, characterized in that, when forming the prism, a recess is provided in the form of a facet breaking one edge of the prism and in that this recess serves at the same time as a recess for fixing the seed crystal in the pulling assembly.

3. A method as claimed in claim 2, characterized in that, when forming the prism, the flats of the prism are set perpendicular to the crystallographic axes OU and OV, and the edge which is provided with the recess, is situated in the bisector plane of the two crystallographic axes OU, OV.

4. A method as claimed in claim 2, characterized in that, when forming the prism, the flats of the prism are set in such a way that one of the characteristic axes OU or OV is situated in their bisector plane, and in that edge which is provided with the recess is situated in the bisector plane containing one of the axes OU or OV.

5. A method as claimed in claim 3, characterized in that the semiconductor material is gallium arsenide (GaAs) and in that the preferential etching bath is composed of 5 volumes of sulphuric acid, 1 volume of hydrogen peroxide, 1 volume of water, and in that the pulling nucleus is immersed in said bath for 2 minutes.

6. A method as claimed in claim 4, characterized in that the semiconductor material is indium phosphide (InP), and in that the preferential etching bath is composed of 1 volume of sulphuric acid, 1 volume of hydrogen peroxide, 1 volume of water; and in that the pulling nucleus is immersed in said bath for 2 minutes.

7. A method as claimed in claim 1, characterized in that the pulling axis OZ is the (001) axis.

8. A method as claimed in claim 7, characterized in that the chosen characteristic axis OU and OV are the axes (110) and ($\bar{1}$10) of the crystal.

9. A method as claimed in claim 8, characterized in that the major flat is formed perpendicularly to the (110) axis and the minor flat is formed perpendicularly to the axis ($\bar{1}$10) of the crystal.

* * * * *